United States Patent
Haas et al.

(10) Patent No.: US 8,117,987 B2
(45) Date of Patent: Feb. 21, 2012

(54) HOT WIRE CHEMICAL VAPOR DEPOSITION (CVD) INLINE COATING TOOL

(75) Inventors: Dieter Haas, San Jose, CA (US); Pravin K. Narwankar, Sunnyvale, CA (US); Randhir P. S. Thakur, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/873,299

(22) Filed: Aug. 31, 2010

(65) Prior Publication Data

US 2011/0104848 A1    May 5, 2011

Related U.S. Application Data

(60) Provisional application No. 61/243,956, filed on Sep. 18, 2009.

(51) Int. Cl.
*A61D 3/00* (2006.01)

(52) U.S. Cl. ............ 118/723 HC; 118/718; 118/719; 118/728; 438/490; 438/680

(58) Field of Classification Search ............ 118/718, 118/719, 728, 723 HC; 438/490, 680
See application file for complete search history.

(56) References Cited

U.S. PATENT DOCUMENTS

| | | | |
|---|---|---|---|
| 5,016,562 A * | 5/1991 | Madan et al. | 118/719 |
| 6,280,790 B1 * | 8/2001 | White et al. | 427/8 |
| 6,427,622 B2 * | 8/2002 | Madan et al. | 118/723 HC |
| 6,488,777 B2 | 12/2002 | Madan et al. | |
| 6,653,212 B1 | 11/2003 | Yamanaka et al. | |
| 7,041,984 B2 * | 5/2006 | Ellefson et al. | 250/427 |
| 7,749,917 B1 * | 7/2010 | Rana et al. | 438/765 |
| 2002/0117199 A1 | 8/2002 | Oswald | |
| 2010/0263717 A1 * | 10/2010 | Wang et al. | 136/252 |

FOREIGN PATENT DOCUMENTS

| | | |
|---|---|---|
| JP | 2004091821 A | 3/2004 |
| WO | WO 2009/009499 A1 | 1/2009 |

(Continued)

OTHER PUBLICATIONS

Trassl et al., "Successful Market Entry of Applied Materials' ATON™ System for Sputtered SiN:H", Conference Paper, European Photovoltaic Solar Energy Conference, Sep. 4, 2006.

(Continued)

*Primary Examiner* — Jarrett Stark
*Assistant Examiner* — Nicholas Tobergte
(74) *Attorney, Agent, or Firm* — Alan Taboada; Moser Taboada

(57) ABSTRACT

Methods and apparatus for hot wire chemical vapor deposition (HWCVD) are provided herein. In some embodiments, an inline HWCVD tool may include a linear conveyor for moving a substrate through the linear process tool; and a multiplicity of HWCVD sources, the multiplicity of HWCVD sources being positioned parallel to and spaced apart from the linear conveyor and configured to deposit material on the surface of the substrate as the substrate moves along the linear conveyor; wherein the substrate is coated by the multiplicity of HWCVD sources without breaking vacuum. In some embodiments, methods of coating substrates may include depositing a first material from an HWCVD source on a substrate moving through a first deposition chamber; moving the substrate from the first deposition chamber to a second deposition chamber; and depositing a second material from a second HWCVD source on the substrate moving through the second deposition chamber.

20 Claims, 4 Drawing Sheets

FOREIGN PATENT DOCUMENTS

WO WO 2009/061322 A1 5/2009

OTHER PUBLICATIONS

Ballif et al., "Flexcellence: Towards Roll-to-Roll Mass-Production of Low Cost Thin Flim Silicon Solar Cells", Preprint 22$^{nd}$ EU-PVSEC Conference, Milano, Italy, Sep. 2007.

Bink et al., "Continuous Hot-Wire Chemical Vapor Deposition on Moving Glass Substrates", Thin Solid Films, vol. 517, Issue 12, pp. 3588-3590 (Apr. 30, 2009).

International Search Report and Written Opinion mailed Apr. 29, 2011 for PCT Application No. PCT/US2010/047972.

* cited by examiner

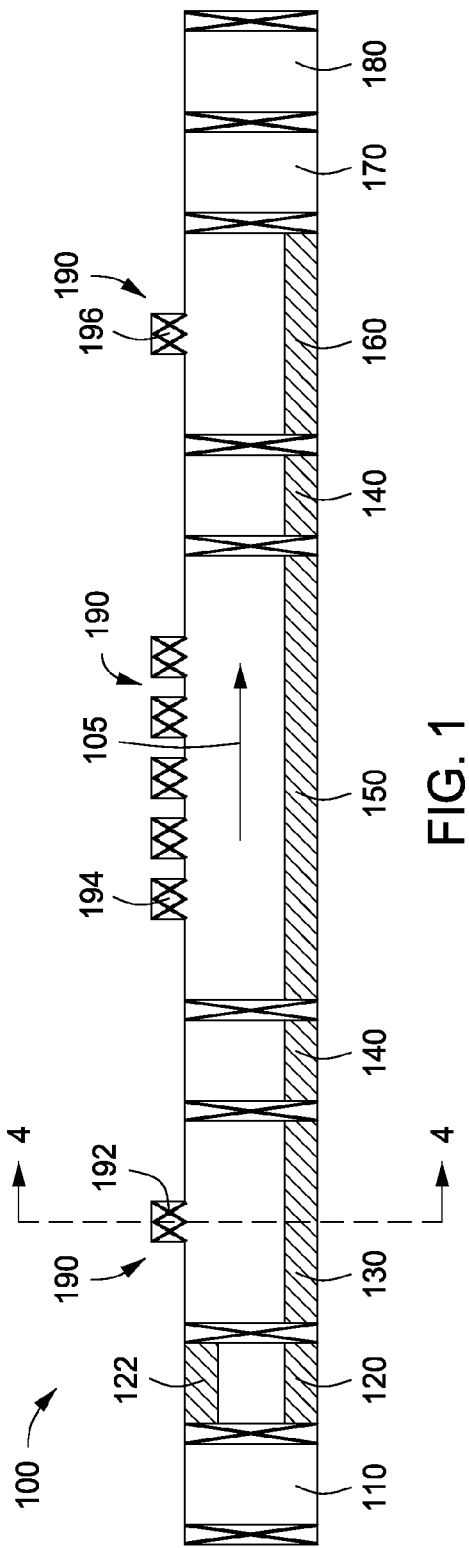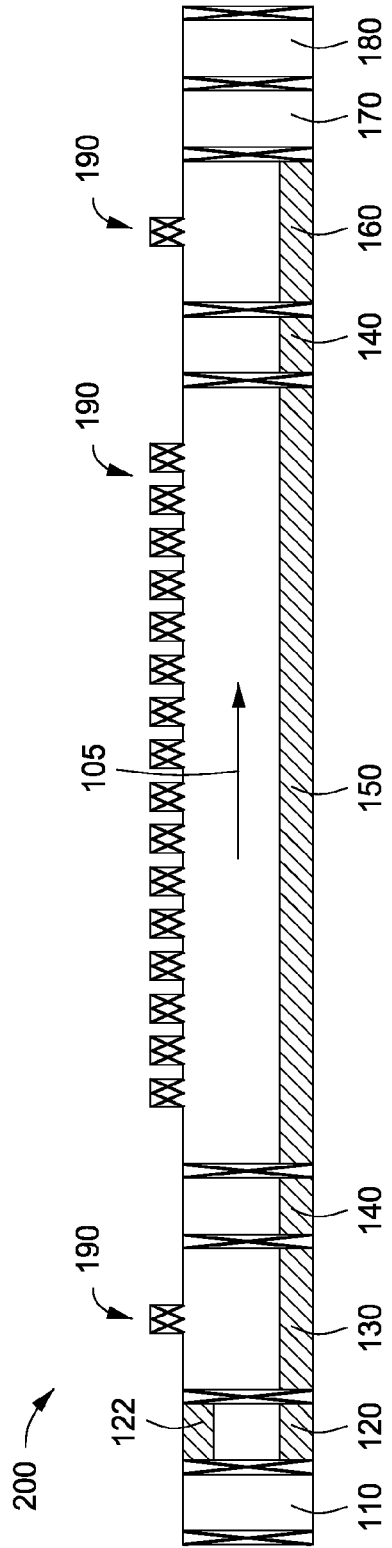

HOT WIRE CHEMICAL VAPOR DEPOSITION (CVD) INLINE COATING TOOL

CROSS-REFERENCE TO RELATED APPLICATIONS

This application claims benefit of U.S. provisional patent application Ser. No. 61/243,956, filed Sep. 18, 2009, which is herein incorporated by reference.

FIELD

The present invention relates generally to hot wire chemical vapor deposition (HWCVD) semiconductor process tools, and more particularly to HWCVD tools for inline processing of substrates.

BACKGROUND

Currently, all commercially available silicon-based thin film solar cells are produced using plasma enhanced chemical vapor deposition (PECVD) coating tools. However, the inventors have observed that PECVD processes suffer from various undesirable limitations, such as: low process gas utilization (for example, about 3% to 20%); poor layer uniformity; introduction of plasma or charge induced defects in the deposited films or in the substrates themselves; deposition is static due to electrical grounding requirement; scaling-up is difficult because of RF requirements; high system cost; low deposition rate (for example, approximately 0.5 nm/s for silicon); and deposition chambers are cleaned using $NF_3$ (a greenhouse gas).

Although HWCVD deposition processes are potentially suitable for silicon thin film deposition in manufacturing (see, for example, Matsumura et al., Thin Solid Films 516(5) 537-540 (2008)), the inventors have observed that there are no robust manufacturing deposition tools suitable to realize the full manufacturing potential of HWCVD sources for silicon thin film deposition on large substrates.

Thus, the inventors have provided a processing system that integrates HWCVD sources into a robust manufacturing deposition tool that is suitable to enhance the manufacturing potential of HWCVD sources for silicon thin film deposition on large substrates. Embodiments of the inventive processing system provide deposition systems for fabrication of silicon-based thin film solar cells that may have one or more of the following benefits: more efficient, lower cost, high throughput, and more readily scalable. Embodiments of the present invention may also be utilized in the fabrication of other thin film devices such as thin film batteries, polymer devices, flexible photovoltaic devices, and flexible electronics.

SUMMARY

In general, embodiments of the present invention provide HWCVD inline coating tools that may provide one or more manufacturing advantages. The inline coating tools provide dynamic deposition by moving substrates under HWCVD line sources. Dynamic deposition in inline tools provides very high HWCVD line source utilization (up to 100%). Multiple HWCVD sources may be provided inline so that coating as desired may be completed without a vacuum break. For applications which are very sensitive to contaminants, separation chambers may be provided between deposition chambers. For example, vacuum separation chambers may be provided between the three deposition stages of p-i-n solar devices to reduce cross-contamination.

In some embodiments of the present invention, shields and replaceable liners may be integrated into the deposition chambers of the inline tool to reduce the use of cleaning processes involving greenhouse gases such as $NF_3$. For example, such shields and replaceable liners may be positioned to limit the deposition of materials on undesired locations of the deposition chamber (for example, on walls of the deposition chamber).

Furthermore, in some embodiments of the present invention, HWCVD line sources may include mechanical clamping fixtures configured to control the temperature gradient of the line source wire close to the clamped ends.

Embodiments of the present invention are applicable to coating tools for a wide range of devices, including, but not limited to, solar cells, thin film batteries, polymer devices, thin film transistor (TFT) displays, flexible photovoltaics and flexible electronics.

In some embodiments of the invention, an inline HWCVD tool may include a linear conveyor for moving a substrate through the linear process tool; and a multiplicity of HWCVD sources, the multiplicity of HWCVD sources being positioned parallel to and spaced apart from the linear conveyor and configured to deposit material on the surface of the substrate as the substrate moves along the linear conveyor; wherein the substrate is coated by the multiplicity of HWCVD sources without breaking vacuum. The linear conveyor may be either a conveyor belt on which the substrate is placed directly, or a means for moving the substrate which involves the substrate being held on a carrier. Further, the multiplicity of HWCVD sources may be divided into a plurality of deposition chambers, each chamber being dedicated to deposition of a different material. Furthermore, the deposition chambers may be separated by separation chambers for reduction of cross-contamination between the deposition chambers. Yet further, the HWCVD tool may be configured for deposition of solar cells—either amorphous silicon or microcrystalline silicon p-i-n devices.

In some embodiments of the present invention, a method of coating substrates in an inline tool, wherein a first deposition process and a second deposition process are carried out in series may include carrying out the first deposition process, wherein the first deposition process includes dynamically depositing a first material from an HWCVD source on a substrate moving through a first deposition chamber; moving the substrate from the first deposition chamber into a second deposition chamber; and carrying out the second deposition process, wherein the second deposition process includes dynamically depositing a second material from a second HWCVD source on the substrate moving through the second deposition chamber.

In some embodiments of the present invention, a method of coating substrates in an inline tool, wherein a first deposition process and a second deposition process are carried out in series, may include carrying out the first deposition process, wherein the first deposition process includes dynamically depositing a first material from an HWCVD source on a substrate in a first deposition chamber; moving the substrate into a separation chamber between the first deposition chamber and a second deposition chamber; closing a first vacuum isolation valve between the first deposition chamber and the separation chamber; opening a second isolation valve between the separation chamber and the second deposition chamber; moving the substrate into the second deposition chamber; closing the second isolation valve; and carrying out the second deposition process, wherein the second deposition process includes dynamically depositing a second material from a second HWCVD source on the substrate in the second deposition chamber; wherein the passage of the substrate through the separation chamber is programmed to reduce cross-contamination between the first and second deposition chambers. Furthermore, between the steps of closing the first vacuum isolation valve and of opening the second isolation valve, purging and pumping down the separation chamber to remove gas from the first process and introducing gas at required pressure for the second process. Furthermore, after closing the second isolation valve, purging, pumping down, and optionally filling with gas the isolated separation chamber. Furthermore, the substrates move at a first speed through the first and second deposition chambers and at a second speed through the separation chamber, wherein the first speed is less than the second speed. Furthermore, the process may be for forming solar devices on the substrate.

Other and further embodiments and variations of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

FIG. 1 is a representation of an inline coating tool configured for depositing amorphous silicon p-i-n structures, according to some embodiments of the present invention.

FIG. 2 is a representation of an inline coating tool configured for depositing microcrystalline silicon p-i-n structures, according to some embodiments of the present invention.

Figure 3:
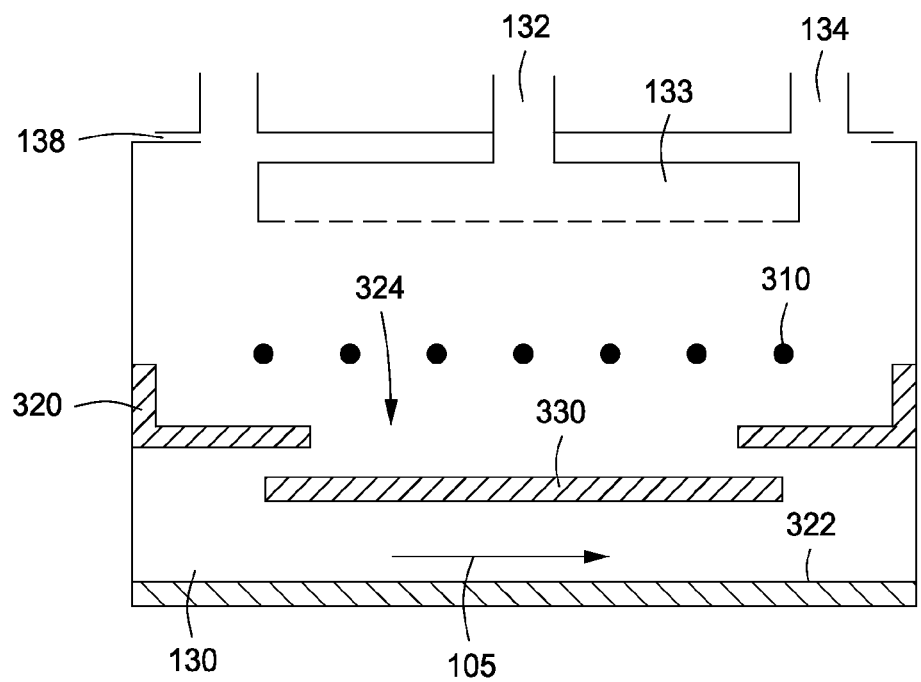
FIG. 3 is a cross-section in the plane of FIG. 1 of a HWCVD deposition chamber, according to some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

FIG. 1 is a representation of an inline coating tool 100 having a plurality of process chambers each having one or more processing sources 190, according to some embodiments of the present invention. The processing sources 190 may be configured for the deposition or removal of material on a substrate that passes though the respective process chambers of the inline coating tool 100. For example, the processing sources 190 may be deposition sources such as physical vapor deposition (PVD) sources or hot wire chemical vapor deposition (HWCVD) sources. Alternatively, the processing sources 190 may be material removal sources such as laser sources or e-beam sources. Inline coating tools in accordance with embodiments of the present invention at least contain one or more HWCVD sources for the deposition of material on the substrate.

The number and configuration of the processing sources 190 may be arranged as desired for a particular process. For example, in FIG. 1, the tool is illustratively shown having HWCVD sources 192, 194, and 196 configured for deposition of amorphous silicon p-i-n structures, suitable for fabricating solar devices, although deposition of other thin films and structures are contemplated. The tool comprises a series of vacuum chambers through which substrates are moved in a linear mode. The direction in which substrates move is shown by arrow 105. Inline tools typically move substrates on a conveyer (for example, driven rollers); the substrate may be placed directly on the conveyor or a carrier may be used to hold the substrate. In some embodiments, the linear conveyor may be configured to independently move one or more substrates through the various chambers and portions of the inline coating tool 100. For example, the linear conveyor may be configured to move a substrate at different speeds through different chambers, different portions of a chamber, or different portions of the inline coating tool 100.

In some embodiments, an entrance chamber 110 and an exit chamber 180 may be provided, where substrates are loaded and unloaded, respectively. The entrance chamber 110 and the exit chamber 180 may provide pump down and back to air functions to facilitate transfer of substrates from atmospheric conditions outside of the inline coating tool 100 to conditions within the inline coating tool 100 (which may include vacuum pressures). Buffer chambers 120 and 170 may be provided to: first, heat the substrate (if required, for example with suitable heater 122, such as radiant lamps, configured to heat a substrate disposed in the buffer chamber); and second, further reduce the chamber pressure (increase degassing time) before entering the deposition chambers.

Process chambers 130, 150 and 160 may be configured for dynamic deposition of similar or dissimilar materials (such as p, i, and n amorphous silicon, respectively), using HWCVD sources 192, 194, and 196, respectively (in which case the process chambers may be referred to herein as deposition chambers 130, 150, and 160). Deposition chambers may include a central processing area, disposed generally opposite the HWCVD sources, and transfer areas disposed on either side of the processing area. In some embodiments, the transfer areas may be shielded from the HWCVD sources such that deposition of material on the substrate is limited or prevented when the substrate is disposed in the transfer area of the deposition chamber. Separation chambers 140 may be strategically placed between the deposition chambers to minimize cross-contamination. Vacuum isolation valves are provided between every chamber to isolate each chamber from adjacent chambers. If required by a particular deposition process, the substrates may be heated as they pass through any or all of chambers 120, 130, 140, 150, and 160 by suitable heaters (not shown). For example, the substrate may be heated radiantly with tube or lamp heaters, conductively by contact with a heated carrier having mechanical contact with the substrate, convectively by providing a small gap filled with a gas between a heater and the substrate, or combinations thereof.

An inline system as represented in FIG. 1 may be implemented on a platform such as the ATON™ platform or NEW ARISTO™ platform manufactured by Applied Materials, Inc., of Santa Clara, Calif. Although FIG. 1 depicts a particular configuration of the inline coating tool 100, other configurations are contemplated. For example fewer or greater numbers of deposition chambers and HWCVD sources may be provided, separation chambers may be omitted or only placed between certain deposition chambers, buffer chambers may be omitted, or the like. in addition, as mentioned above, PVD sources may be used in certain deposition chambers adjacent to deposition chambers having HWCVD sources. For example, in some embodiments, the inline processing tools 100 or 200, or variants thereof, may be modified to provide a PVD source in the central deposition chamber 150, with adjacent deposition chambers 130 and 160 having HWCVD sources. Alternatively, in some embodiments, after deposition of materials on the substrate in one deposition chamber, a process chamber configured with a material removal source may be provided to remove part of the deposited layer, for example, using a laser or e-beam process. Additional materials may then be deposited in a subsequent deposition chamber having either an HWCVD or PVD source.

FIG. 2 is a representation of an inline coating tool 200 with HWCVD sources, according to some embodiments of the present invention. In FIG. 2, the tool is shown configured for deposition of microcrystalline silicon p-i-n structures, suitable for fabricating solar devices. Apart from the length of the deposition chambers, and the sources, the set-up of the chambers is the same as in FIG. 1.

The number of HWCVD deposition sources for a required deposited layer thickness on the substrate depends on the exposure time (e.g., the substrate speed through the deposition area) and the source deposition rate. The i-layer for a microcrystalline silicon photocell is much thicker and requires more deposition sources compared to the i-layer of an amorphous silicon photocell. The length of chamber 150 in FIGS. 1-2 clearly shows this difference. The p and n layers are thin for both amorphous and microcrystalline silicon. Consequently, the differences in the length of chambers 130 and 160 between FIGS. 1-2 are much less than for the i-layer. The number of sources used in a particular chamber may be adjusted for various process. Thus, the inline system can be optimized easily to ensure minimal cost and maximal source utilization. For example, each chamber may include a plurality of locations, or compartments, where the sources are coupled to the chamber. By utilizing varying numbers of the compartments, greater or fewer sources may be installed as needed for a desired process. If a process requires more sources than available compartments in a given chamber, the chamber may be replaced or an additional chamber may be added in line to obtain the desired thickness of material deposited on the substrate.

Figure 4:
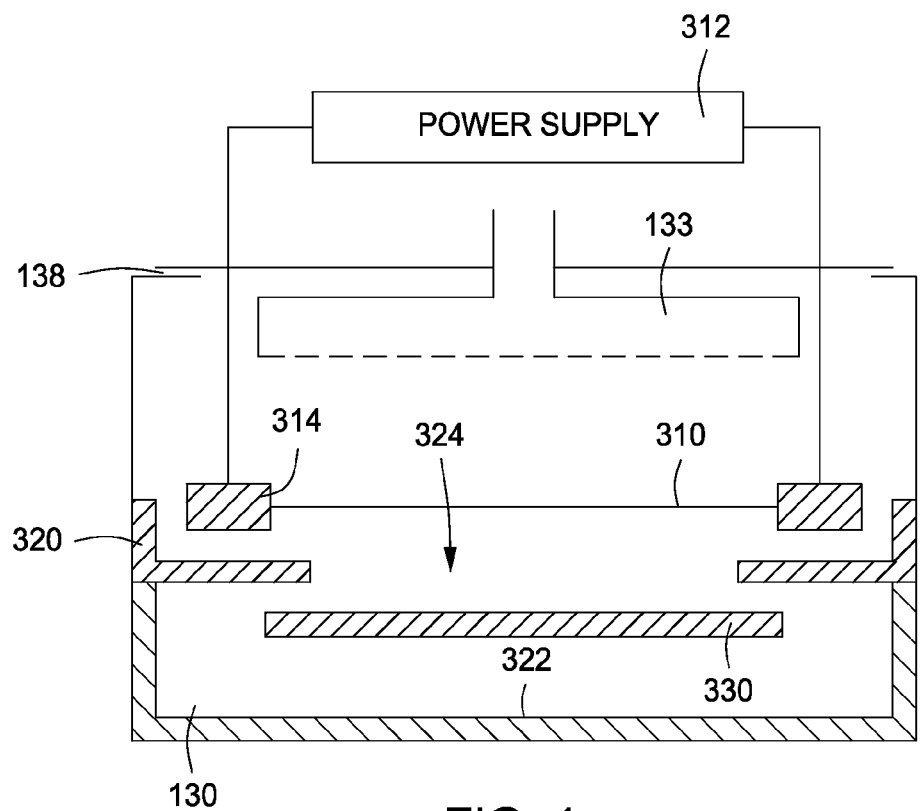
FIG. 4 is a cross-section along section lines 4-4 in FIG. 1 of a HWCVD deposition chamber, according to some embodiments of the present invention.

FIG. 3 is a detailed cross-section of chamber 130 in the plane of FIG. 1 and FIG. 4 is a vertical cross-section along section line 4-4 through chamber 130 in FIG. 1. The cross-sections show the HWCVD wires 310 which make up the HWCVD source (also see FIG. 4 for a plan view of a HWCVD source). Wires 310 are typically made of tungsten, although tantalum or iridium are also possibilities. The wire is clamped in place by support structures 314 to keep the wire taught when heated to high temperature, and to provide electrical contact to the wire. A power supply 312 provides the current to heat the wire 310. The HWCVD source is disposed within the deposition chamber (for example deposition chamber 130). The chamber 130 has a gas inlet 132 for providing a process gas and an outlet 134 to a vacuum pump for maintaining a suitable operating pressure and to remove excess process gases and/or process byproducts. The gas inlet 132 may feed into a shower head 133, or other suitable gas distribution element, for distributing the gas uniformly over the wires 310.

In some embodiments, one or more shields 320 are provided to minimize unwanted deposition on the chamber walls. Alternatively or in combination, chamber liners 322 can be used to make cleaning easier. The use of shields, and liners, may preclude or reduce the use of undesirable cleaning gases, such as the greenhouse gas $NF_3$. The shields 320 and chamber liners 322 generally protect the chamber walls from undesirably collecting coating due to the process gases flowing in the chamber. The shields 320 and chamber liners 322 may be replaceable and/or cleanable. The shields 320 and chamber liners 322 may be configured to cover every area of the process chamber that could become coated, including but not limited to, around the wires and on all walls of the coating compartment. Typically, the shields 320 and chamber liners 322 may be fabricated from aluminum (Al) and may have a roughened surface to enhance adhesion of deposited materials (to prevent flaking off of deposited material). The shields 320 and chamber liners 322 may be mounted in the desired areas of the process chamber, such as around the HWCVD sources, in any suitable manner. In some embodiments, the source, shields, and liners may be removed for maintenance and cleaning by opening an upper portion of the deposition chamber. For example, in some embodiments, the a lid, or ceiling, of the deposition chamber may be coupled to the body of the deposition chamber along a flange 138 that supports the lid and provides a surface to secure the lid to the body of the deposition chamber. The substrate 330 moves under the HWCVD in a direction 105.

Figure 5:
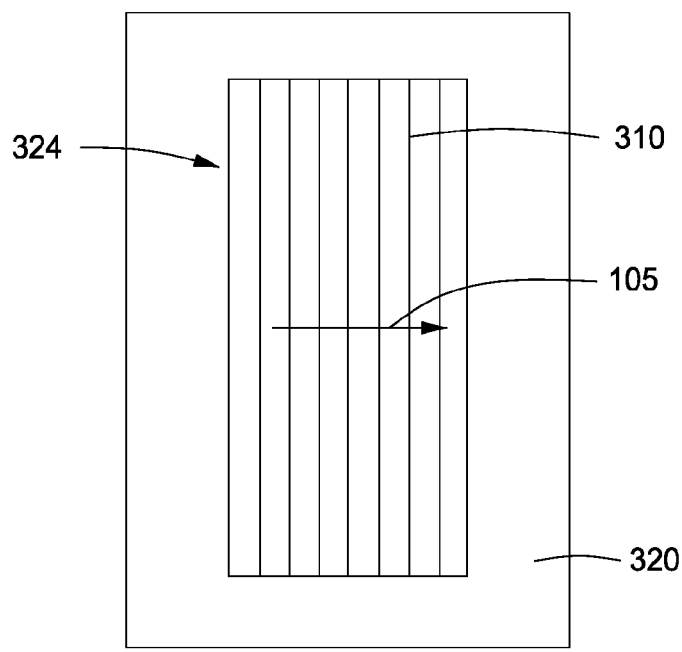
FIG. 5 is a plan view of a hot wire CVD source, according to some embodiments of the present invention.

FIG. 5 is a plan view representation of a HWCVD source, according to some embodiments of the present invention. The source comprises a multiplicity of evenly spaced parallel wires 310. There are typically between 5 and 30 wires in a source, although other numbers of wires may be used. The wires may be arranged parallel or perpendicular to the leading edge of the substrate (a parallel configuration is shown in FIG. 5). Arranging the wires to run perpendicular to the leading edge of the substrate may allow for, in some embodiments, shorter wire lengths to be used, and/or different wire temperatures to be provided in different regions of the substrate, for example center and edge regions of the substrate. One or more shields 320, placed between the wires and a substrate, may define an opening 324 that defines the deposition area at the substrate and may reduce unwanted deposition of material on the chamber walls. The substrate moves under the HWCVD source in the direction of the arrow 105. See FIGS. 3, 4, and 7 for more details.

Figure 6:
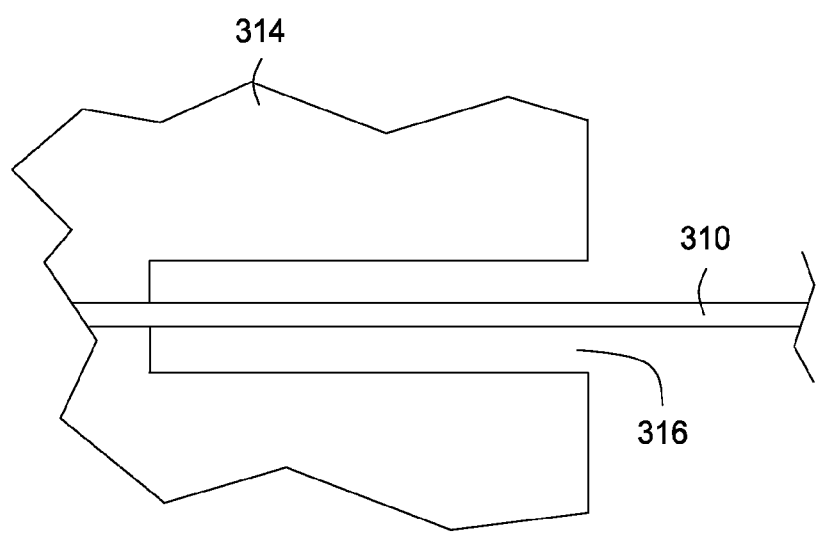
FIG. 6 is a cross-section of a detail of a support structure for a HWCVD wire, according to some embodiments of the present invention.

FIG. 6 is a detailed view of part of the support structure 314 in FIGS. 3-4. A cylindrical recess 316 may be provided in the support structure 314 at the point where the wire 310 is clamped in place, such that the wire is along the long axis of the cylindrical recess. The cylindrical recess 316 may be used to tailor the temperature profile along the heated wire. For example, the walls of the recess 316 may be made of a refractory material such as stainless steel, and may be machined to be smooth, so as to reflect heat and light back to the hot wire. During operation, the support structure may be at a temperature of about 20 degrees Celsius to about 400 degrees Celsius—and the part of the wire functioning as a deposition source will be at a temperature in the region of about 1,500 to about 2,500 degrees Celsius. The recess in the support structure is configured so that the temperature of the wire goes from near room temperature to an operating temperature of approximately 1,500 degrees Celsius within the length of the cylindrical recess. The support structure 314 is configured to protect the wire from contact with the process gas in areas where the wire temperature is below a critical temperature—approximately 1500 degrees Celsius for tungsten (W) wire.

Figure 7:
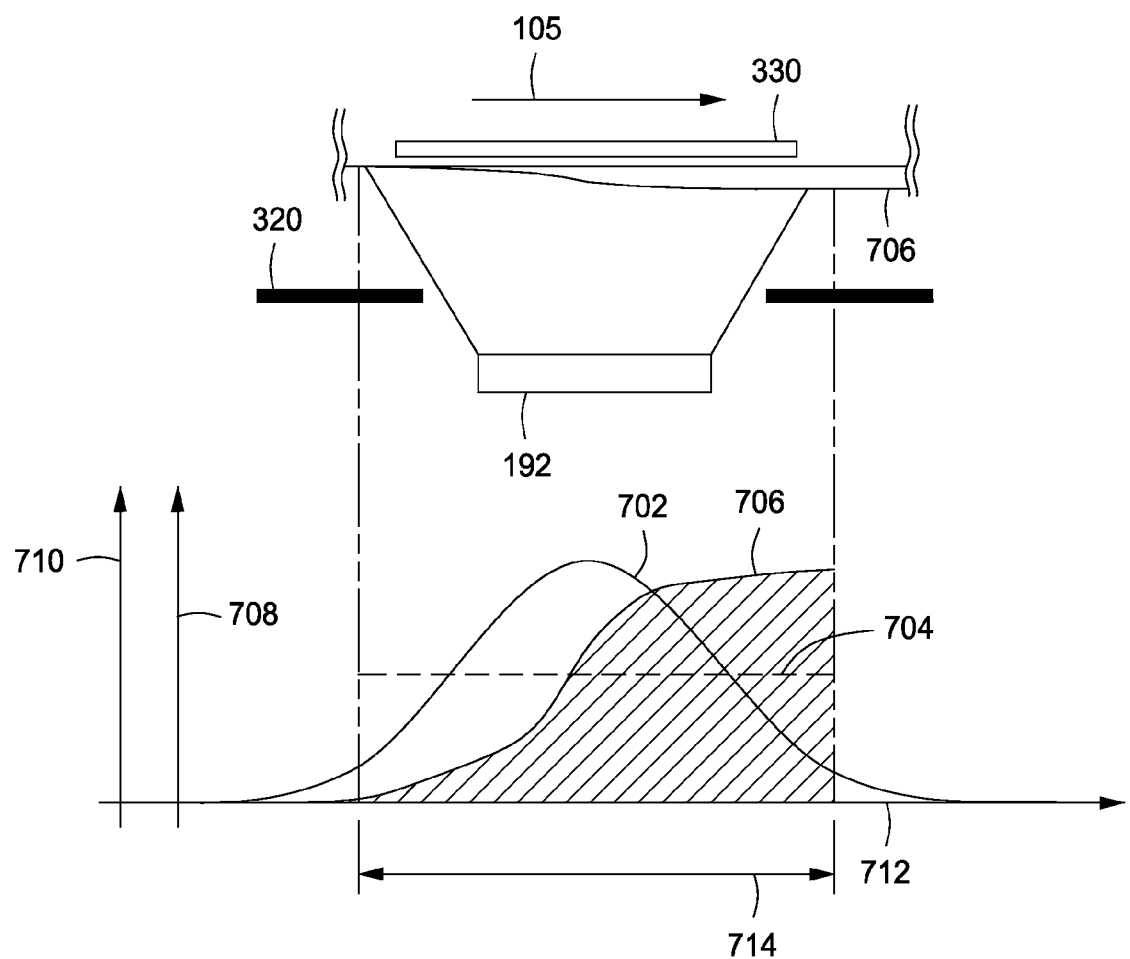
FIG. 7 is a representation of details of the coating of a substrate using an HWCVD source, according to some embodiments of the present invention.

FIG. 7 is a representation of details of the coating of a substrate using an HWCVD source, according to some embodiments of the present invention. Plots of static deposition rate coating profile 702 for a point/line source (line source perpendicular to the plane of the figure), average static deposition rate 704, and layer growth 706 during dynamic deposition (substrate moves under source) are shown in the lower part of the figure along horizontal axis 712 (substrate position) and vertical axes 708 (deposition rate) and 710 (deposition thickness). The advantage of dynamic deposition is immediately evident. In the upper part of the figure, the layer growth 706 during movement of the substrate 330 past the source 192 in the direction 105 is shown, where the thickness is measured at a fixed point on the substrate. Shields 320 are shown defining the extent of the deposition area within the active coating window 714.

The following chart provides further details of some of the advantages of dynamic deposition, as provided by an inline tool in accordance with embodiments of the present invention, over static deposition:

| DYNAMIC DEPOSITION | STATIC DEPOSITION |
| --- | --- |
| Better quality of interfaces and surfaces with a dynamic coater as the surface of the device can be protected from unwanted deposition, transients in a recipe or sequence. | To achieve the same result as dynamic coating the substrate/device needs to be protected by a shutter. |
| Pre and post treatment can be seamlessly integrated in to the flow, while maintaining the integrity (contamination free) of individual process ambients. | To achieve the same result the cluster tool approach has to be adopted where the pre and post treatment might require a separate (expensive) chamber. |
| Bulk film property (composition or morphology through the depth of the film) will be more homogeneous; although, if controlled variation of the composition or morphology is desired, then a layer by layer approach can be easily adapted by spacing sources adequately apart without having to compromise on individual layer homogeneity. For example 20 nm of microcrystalline-Si + 5 nm of amorphous-Si + 20 nm of microcrystalline Si + 5 nm of amorphous-Si, etc. stack can be achieved by having individual sources with different gas chemistry ratios rather than having to change in a recipe on a single source. | Impossible to achieve a homogeneous layer by layer approach within the same chamber. Even if a shutter is used in between different recipes, contamination and particle formation will still be a problem. |
| The life time of the HWCVD filament source can be much more prolonged due to exposure to a consistently identical chemical ambient and temperature control. | Recipe transients expose the HWCVD filaments to different ambients and thermal cycling resulting in a potential reduction in life time of the filaments. |
| Different source regions can be made of different filament materials, or filament temperatures can be maintained at different albeit constant temperatures. For example, if at the interface we want a low deposition rate then this can be accomplished by using Ta filaments whereas in the high deposition rate region one can use W filament or different filament temperatures at different line (area) sources. | To mimic the dynamic coating the filament in the static coater has to go through temperature cycling during processing which can expose the device surface to transients and unwanted radical species. |

With reference to FIG. 1, a method of coating substrates using a HWCVD source according to some embodiments of the present invention is described. In some embodiments of the present invention, a method of coating substrates in an inline tool, wherein a first deposition process and a second deposition process are carried out in series may include carrying out the first deposition process, wherein the first deposition process includes dynamically depositing a first material from an HWCVD source on a substrate moving through a first deposition chamber; moving the substrate from the first deposition chamber into a second deposition chamber; and carrying out the second deposition process, wherein the second deposition process includes dynamically depositing a second material from a second HWCVD source on the substrate moving through the second deposition chamber.

In some embodiments, a method of coating substrates in an inline tool, wherein a first deposition process and a second deposition process are carried out in series, may include carrying out the first deposition process, wherein the first deposition process includes dynamically depositing a first material from an HWCVD source on a substrate in a first deposition chamber; moving a substrate into a separation chamber between the first deposition chamber and a second deposition chamber; closing a first vacuum isolation valve between the first deposition chamber and the separation chamber; opening a second isolation valve between the separation chamber and the second deposition chamber; moving the substrate into the second deposition chamber; closing the second isolation valve; and carrying out the second deposition process, wherein the second deposition process includes dynamically depositing a second material from a second HWCVD source on the substrate in the second deposition chamber; wherein the passage of the substrate through the separation chamber is programmed to reduce cross-contamination between the first and second deposition chambers.

Furthermore, between the steps of closing the first vacuum isolation valve and of opening the second isolation valve, purging and pumping down the separation chamber to remove gas from the first process and introducing gas at required pressure for the second process. Furthermore, after closing the second isolation valve, purging, pumping down, and optionally filling with gas the isolated separation chamber.

The substrates may be moved faster through deposition chambers than through the separation chamber. For example, during deposition, the substrate may move with a slow speed underneath the source. If the substrate is completely in a transfer area (adjacent to the separation chamber), a first gate valve opens, the substrate moves fast into the separation chamber and the gate valve closes again. Then the separation chamber can be purged and pumped to remove all gas from the previous process and introduce the gas/pressure required for the next process. Next, a second gate valve (towards the next processing chamber) opens, the substrate moves fast into the transfer area and the gate valve closes again. The isolated separation chamber is purged, pumped down and maybe filled with process gas. This sequence repeats for every substrate. Depending on the exposure time and separation requirements, the purge and pump cycle may be adjusted. Note that there is continuous coating in the process chamber while the other substrates leave the coating area and transfer to the separation chamber and then into the next process area.

Some embodiments of the HWCVD system of the present invention, when used for fabrication of silicon-based thin film solar devices, may provide some or all of the following desirable attributes over PECVD systems: higher process gas utilization, in the range of 50%-90%, which reduces fab maintenance costs and provides safer deposition systems; good layer uniformity, particularly when using dynamic deposition; easily scaled-up; manufacturer's cost to build system may be up to 50% lower; higher deposition rate—2 to 10 nm/s for silicon; use of shields with HWCVD source eliminates need to use greenhouse gases such as $NF_3$.

A wide range of substrates may be used with the present invention, depending on the devices being fabricated and the process conditions. Non-limiting examples of substrates may include: large area glass for manufacturing solar cells; ceramic; semiconductor; metal; and polymer/plastic.

Although embodiments of the present invention have been described primarily for fabrication of silicon-based thin film solar devices, some embodiments of the present invention may be used for fabricating solar cells, thin film batteries, polymer devices, thin film transistor (TFT) and plasma displays, flexible photovoltaics and flexible electronics. Furthermore, embodiments of the present invention for silicon-based thin film solar cell fabrication have been described for either microcrystalline silicon deposition or amorphous silicon deposition. However, some solar devices require deposition of both amorphous and microcrystalline silicon. This may be achieved using two inline systems—one for amorphous silicon and one for microcrystalline silicon. Amorphous silicon and microcrystalline silicon require different process parameter (hydrogen gas flow, silane flow, pressure, temperature, etc.). This may also be achieved with one inline tool having six coating areas (p-i-n amorphous silicon and p-i-n microcrystalline silicon).

Although embodiments of the present invention have been described primarily for deposition on one side of a substrate, the concepts of the present invention can readily be extended to in-line systems for deposition on both sides of a substrate simultaneously. Furthermore, although embodiments of the present invention have been described primarily for inline systems in which the substrates are moved in a horizontal plane either above or below the HWCVD source, the concepts of the present invention can readily be extended to in-line systems in which the substrate conveyor and the HWCVD sources are oriented in vertical, parallel planes (and the substrates are in a vertical plane during deposition).

While the foregoing is directed to embodiments of the present invention, other and further embodiments of the invention may be devised without departing from the basic scope thereof.

The invention claimed is:

1. An inline hot wire chemical vapor deposition (HWCVD) tool, comprising:
    a linear conveyor for moving a substrate through the inline HWCVD tool;
    a deposition chamber having a multiplicity of HWCVD sources disposed within the deposition chamber, the multiplicity of HWCVD sources being positioned parallel to and spaced apart from the linear conveyor and configured to deposit material on a surface of the substrate as the substrate moves along the linear conveyor without breaking vacuum; and
    one or more shields disposed between the multiplicity of HWCVD sources and the linear conveyor to define a deposition area where material is to be deposited on the substrate during operation and to reduce unwanted deposition of material on walls of the deposition chamber.

2. The inline HWCVD tool of claim 1, wherein the linear conveyor is adapted to move the substrate when held on a carrier.

3. The inline HWCVD tool of claim 1, further comprising one or more of:
    a deposition chamber having a physical vapor deposition (PVD) source disposed therein configured to deposit materials via a PVD process, wherein the deposition chamber is disposed inline with the deposition chamber having the multiplicity of HWCVD sources such that the substrate may be coated by the multiplicity of HWCVD sources and the PVD source without breaking vacuum; or
    a process chamber having a material removal source to remove part of the material deposited on the substrate, wherein the process chamber is disposed inline with the deposition chamber having the multiplicity of HWCVD sources such that the substrate may be coated by the multiplicity of HWCVD sources and then be transferred to the process chamber for material removal without breaking vacuum.

4. The inline HWCVD tool of claim 1, further comprising:
    a plurality of deposition chambers, wherein each deposition chamber contains one or more of the multiplicity of HWCVD sources.

5. The inline HWCVD tool of claim 4, wherein each deposition chamber is dedicated to the deposition of a different material.

6. The inline HWCVD tool of claim 4, further comprising:
    a separation chamber disposed between adjacent deposition chambers to reduce cross-contamination between the deposition chambers.

7. The inline HWCVD tool of claim 1, wherein the multiplicity of HWCVD sources are configured for the deposition of solar cells.

8. The inline HWCVD tool of claim 1, wherein the multiplicity of HWCVD sources are configured to deposit amorphous silicon or microcrystalline silicon p-i-n devices.

9. The inline HWCVD tool of claim 1, wherein the deposition chamber further comprises:
    one or more replaceable liners lining at least portions of walls of the deposition chamber to reduce unwanted deposition of material on walls of the deposition chamber.

10. The inline HWCVD tool of claim 1, wherein at least one of the multiplicity of HWCVD sources further comprises:
- a plurality of wires; and
- a plurality of support structures to support each wire of the plurality of wires to keep the wire taught when heated and to provide an electrical connection to a power supply that provides a current to heat the plurality of wires.

11. The inline HWCVD tool of claim 10, wherein the plurality of support structures further include a cylindrical recess at the point where each wire is supported, the cylindrical recess having an axis substantially parallel to the direction of the wire such that a portion of the wire close to the point where the wire is supported extends through the cylindrical recess.

12. The inline HWCVD tool of claim 11, wherein the cylindrical recess further comprises walls made of a refractory material, and wherein the walls are machined smooth so as to reflect heat and light back to the wire extending through the cylindrical recess.

13. An inline hot wire chemical vapor deposition (HWCVD) tool, comprising:
- a linear conveyor for moving a substrate through the inline HWCVD tool;
- a multiplicity of HWCVD sources, the multiplicity of HWCVD sources being positioned parallel to and spaced apart from the linear conveyor and configured to deposit material on a surface of the substrate as the substrate moves along the linear conveyor without breaking vacuum; and
- one or more of:
  - a deposition chamber having a physical vapor deposition (PVD) source disposed therein configured to deposit materials via a PVD process, wherein the deposition chamber is disposed inline with a deposition chamber having the multiplicity of HWCVD sources such that substrate may be coated by the multiplicity of HWCVD sources and the PVD source without breaking vacuum; or
  - a process chamber having a material removal source to remove part of the material deposited on the substrate, wherein the process chamber is disposed inline with a deposition chamber having the multiplicity of HWCVD sources such that the substrate may be coated by the multiplicity of HWCVD sources and then be transferred to the process chamber for material removal without breaking vacuum.

14. The inline HWCVD tool of claim 13, wherein the linear conveyor is adapted to move the substrate when held on a carrier.

15. The inline HWCVD tool of claim 13, further comprising:
- a plurality of deposition chambers, wherein each deposition chamber contains one or more of the multiplicity of HWCVD sources.

16. The inline HWCVD tool of claim 15, further comprising:
- a separation chamber disposed between adjacent deposition chambers to reduce cross-contamination between the deposition chambers.

17. The inline HWCVD tool of claim 15, wherein each deposition chamber is dedicated to the deposition of a different material.

18. The inline HWCVD tool of claim 13, wherein the deposition chamber further comprises:
- one or more replaceable liners lining at least portions of walls of the deposition chamber to reduce unwanted deposition of material on walls of the deposition chamber.

19. The inline HWCVD tool of claim 13, wherein at least one of the multiplicity of HWCVD sources further comprises:
- a plurality of wires; and
- a plurality of support structures to support each wire of the plurality of wires to keep the wire taught when heated and to provide an electrical connection to a power supply that provides a current to heat the plurality of wires.

20. An inline hot wire chemical vapor deposition (HWCVD) tool, comprising:
- a linear conveyor for moving a substrate through the inline HWCVD tool; and
- a multiplicity of HWCVD sources, the multiplicity of HWCVD sources being positioned parallel to and spaced apart from the linear conveyor and configured to deposit material on a surface of the substrate as the substrate moves along the linear conveyor without breaking vacuum, wherein at least one of the multiplicity of HWCVD sources comprises:
  - a plurality of wires; and
  - a plurality of support structures to support each wire of the plurality of wires to keep the wire taught when heated and to provide an electrical connection to a power supply that provides a current to heat the plurality of wires, wherein the plurality of support structures include a cylindrical recess at the point where the wire is supported, the cylindrical recess having an axis substantially parallel to the direction of the wire such that a portion of the wire close to the point where the wire is supported extends through the cylindrical recess, and wherein the cylindrical recess comprises walls made of a refractory material, the walls machined smooth so as to reflect heat and light back to the wire extending through the cylindrical recess.

* * * * *